(12) United States Patent
Park et al.

(10) Patent No.: US 9,859,200 B2
(45) Date of Patent: Jan. 2, 2018

(54) INTEGRATED CIRCUIT PACKAGING SYSTEM WITH INTERPOSER SUPPORT STRUCTURE MECHANISM AND METHOD OF MANUFACTURE THEREOF

(71) Applicant: STATS ChipPAC Pte. Ltd., Singapore (SG)

(72) Inventors: SooSan Park, Seoul (KR); KyuSang Kim, Suwon-si (KR); YeoChan Ko, Namyangju-si (KR); KeoChang Lee, Icheon-si (KR); HeeJo Chi, Yeoju-gun (KR); HeeSoo Lee, Anyang-si (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/792,447

(22) Filed: Jul. 6, 2015

(65) Prior Publication Data
US 2016/0190054 A1    Jun. 30, 2016

Related U.S. Application Data

(60) Provisional application No. 62/097,248, filed on Dec. 29, 2014.

(51) Int. Cl.
*H01L 23/00* (2006.01)
*H01L 23/498* (2006.01)
(Continued)

(52) U.S. Cl.
CPC ...... *H01L 23/49833* (2013.01); *H01L 21/486* (2013.01); *H01L 21/4853* (2013.01); *H01L 21/56* (2013.01); *H01L 23/3121* (2013.01); *H01L 23/3142* (2013.01); *H01L 23/4828* (2013.01); *H01L 23/49816* (2013.01); *H01L 23/49827* (2013.01); *H01L 23/49894* (2013.01);
(Continued)

(58) Field of Classification Search
CPC .......... H01L 23/49894; H01L 23/4828; H01L 24/81; H01L 24/83; H01L 23/49833; H01L 23/49883; H01L 23/3121; H01L 23/3128; H01L 23/3142; H01L 23/5389; H01L 21/56
See application file for complete search history.

(56) References Cited

U.S. PATENT DOCUMENTS 4,654,752 A * 3/1987 Kyle ............... H01L 21/563
257/E21.503
5,759,737 A * 6/1998 Feilchenfeld ........ G03F 7/00
257/E21.503
(Continued)

FOREIGN PATENT DOCUMENTS

CN    101120445 A    2/2008
JP    2008147628 A    6/2008
(Continued)

*Primary Examiner* — Asok K Sarkar
*Assistant Examiner* — Grant Withers
(74) *Attorney, Agent, or Firm* — Wong & Rees LLP

(57) ABSTRACT

A system and method of manufacture of an integrated circuit packaging system includes: a base substrate, the base substrate includes a base terminal; an integrated circuit device on the base substrate; a bottom conductive joint on the base terminal; a conductive ball on the bottom conductive joint, the conductive ball includes a core body; and an interposer over the conductive ball.

10 Claims, 4 Drawing Sheets

(51) Int. Cl.
  *H01L 23/31* (2006.01)
  *H01L 23/482* (2006.01)
  *H01L 21/56* (2006.01)
  *H01L 21/48* (2006.01)
  *H01L 23/538* (2006.01)

(52) U.S. Cl.
  CPC .......... *H01L 24/92* (2013.01); *H01L 23/3128* (2013.01); *H01L 23/5389* (2013.01); *H01L 24/13* (2013.01); *H01L 24/16* (2013.01); *H01L 24/29* (2013.01); *H01L 24/32* (2013.01); *H01L 24/48* (2013.01); *H01L 24/73* (2013.01); *H01L 24/81* (2013.01); *H01L 24/83* (2013.01); *H01L 2224/131* (2013.01); *H01L 2224/16227* (2013.01); *H01L 2224/2919* (2013.01); *H01L 2224/2929* (2013.01); *H01L 2224/29387* (2013.01); *H01L 2224/32225* (2013.01); *H01L 2224/48227* (2013.01); *H01L 2224/73204* (2013.01); *H01L 2224/73253* (2013.01); *H01L 2224/83104* (2013.01); *H01L 2224/92* (2013.01); *H01L 2224/92125* (2013.01); *H01L 2924/00014* (2013.01); *H01L 2924/14* (2013.01); *H01L 2924/15331* (2013.01); *H01L 2924/15747* (2013.01); *H01L 2924/181* (2013.01); *H01L 2924/3511* (2013.01); *H01L 2924/3512* (2013.01)

(56) References Cited

U.S. PATENT DOCUMENTS

| | | | | |
|---|---|---|---|---|
| 6,429,382 | B1 * | 8/2002 | Amami | H01L 23/4828 174/259 |
| 6,815,252 | B2 | 11/2004 | Pendse | |
| 6,940,178 | B2 | 9/2005 | Kweon et al. | |
| 7,368,817 | B2 | 5/2008 | Pendse | |
| 7,459,349 | B1 * | 12/2008 | Yoshida | H01L 23/49816 257/E21.502 |
| 7,608,921 | B2 | 10/2009 | Pendse | |
| 7,678,681 | B2 | 3/2010 | Oi | |
| 7,700,407 | B2 | 4/2010 | Pendse | |
| 7,754,535 | B2 | 7/2010 | Kobayashi | |
| 7,772,687 | B2 | 8/2010 | Inoue | |
| 7,807,510 | B2 | 10/2010 | Kobayashi | |
| 7,827,681 | B2 * | 11/2010 | Kurashima | H01L 21/565 257/698 |
| 7,872,359 | B2 * | 1/2011 | Inoue | H01L 23/49833 257/784 |
| 7,901,983 | B2 | 3/2011 | Pendse | |
| 7,973,406 | B2 | 7/2011 | Pendse | |
| 7,989,707 | B2 * | 8/2011 | Yamano | H01L 21/6835 174/260 |
| 7,994,626 | B2 | 8/2011 | Pendse | |
| 8,026,128 | B2 | 9/2011 | Pendse | |
| 8,035,235 | B2 * | 10/2011 | Jang | H01L 21/565 257/737 |
| 8,076,232 | B2 | 12/2011 | Pendse | |
| 8,106,495 | B2 * | 1/2012 | Kajiki | H01L 21/565 257/678 |
| 8,216,930 | B2 | 7/2012 | Pendse et al. | |
| 8,304,296 | B2 | 11/2012 | Ko et al. | |
| 8,674,496 | B2 * | 3/2014 | Lin | H01L 23/49816 257/690 |
| 8,901,726 | B2 | 12/2014 | Lin et al. | |
| 8,951,834 | B1 * | 2/2015 | Kim | H01L 21/565 257/686 |
| 2007/0267745 | A1 * | 11/2007 | Chao | H01L 24/11 257/737 |
| 2008/0136003 | A1 * | 6/2008 | Pendse | H01L 21/563 257/686 |
| 2009/0001540 | A1 * | 1/2009 | Yang | H01L 23/3128 257/686 |
| 2011/0278736 | A1 * | 11/2011 | Lin | H01L 25/50 257/774 |
| 2012/0068332 | A1 * | 3/2012 | Park | H01L 23/3128 257/737 |
| 2012/0119360 | A1 * | 5/2012 | Kim | H01L 21/565 257/737 |
| 2012/0193783 | A1 * | 8/2012 | Hong | H01L 23/3128 257/737 |
| 2013/0134588 | A1 * | 5/2013 | Yu | H01L 23/49811 257/738 |
| 2013/0341786 | A1 * | 12/2013 | Hsu | H01L 21/4857 257/737 |
| 2014/0042622 | A1 | 2/2014 | Tsai et al. | |
| 2014/0103527 | A1 * | 4/2014 | Marimuthu | H01L 23/3121 257/737 |
| 2014/0183733 | A1 | 7/2014 | Chu et al. | |
| 2014/0264842 | A1 | 9/2014 | Lin et al. | |
| 2014/0264858 | A1 | 9/2014 | Chen et al. | |
| 2015/0001741 | A1 * | 1/2015 | Lee | H01L 23/3114 257/787 |
| 2015/0179616 | A1 * | 6/2015 | Lin | H01L 25/50 257/773 |
| 2015/0200176 | A1 * | 7/2015 | Mori | H01L 24/81 257/737 |

FOREIGN PATENT DOCUMENTS

| | | |
|---|---|---|
| KR | 20070100355 A | 10/2007 |
| KR | 20080052482 A | 6/2008 |
| TW | 200828563 A | 7/2008 |

* cited by examiner

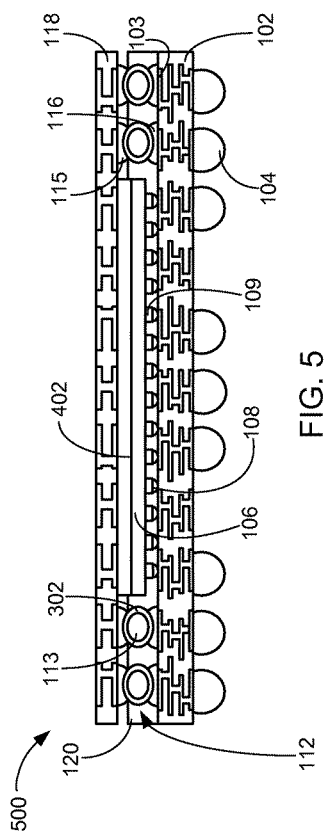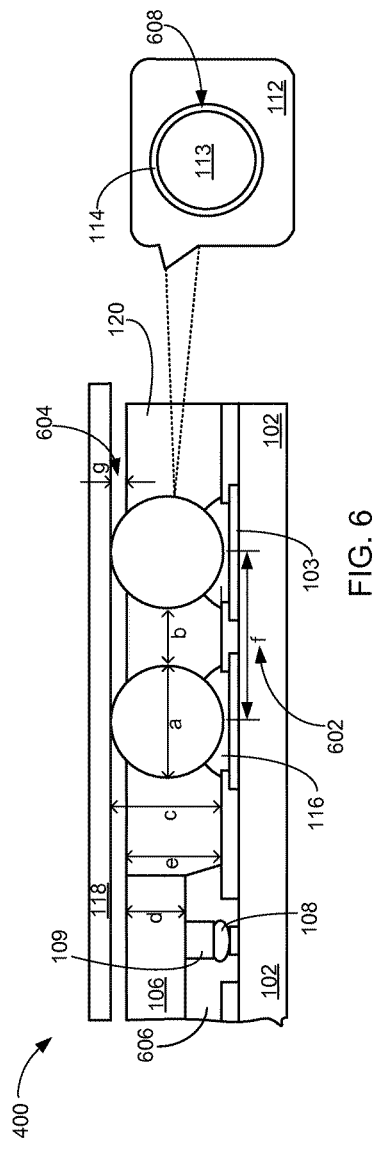

INTEGRATED CIRCUIT PACKAGING SYSTEM WITH INTERPOSER SUPPORT STRUCTURE MECHANISM AND METHOD OF MANUFACTURE THEREOF

CROSS-REFERENCE TO RELATED APPLICATION(S)

This application claims the benefit of U.S. Provisional Patent Application Ser. No. 62/097,248 filed Dec. 29, 2014, and the subject matter thereof is incorporated herein by reference thereto.

TECHNICAL FIELD

The present invention relates generally to an integrated circuit packaging system, and more particularly to a system with an interposer support structure mechanism.

BACKGROUND ART

The rapidly growing market for portable electronics devices, e.g. cellular phones, laptop computers, and personal digital assistants (PDAs), is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

For example, current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses, and cost.

As these packaging systems evolve to incorporate more components with varied environmental needs, the pressure to push the technological envelope becomes increasingly challenging. More significantly, with the ever-increasing complexity, the potential risk of error increases greatly during manufacture.

Among the problems being encountered with the shrinking of packaging systems is the reduction in contact area between ball grids, package terminals, and the printed circuit boards (PCBs) to which they need to be attached. This reduction in contact area makes it easier for the packaging systems to have poorer electrical contacts or to become detached from the PCBs.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base substrate, the base substrate includes a base terminal; mounting an integrated circuit device on the base substrate; forming a bottom conductive joint on the base terminal; mounting a conductive ball on the bottom conductive joint, the conductive ball includes a core body; and mounting an interposer over the conductive ball.

The present invention provides an integrated circuit packaging system including a base substrate, the base substrate includes a base terminal; an integrated circuit device on the base substrate; a bottom conductive joint on the base terminal; a conductive ball on the bottom conductive joint, the conductive ball includes a core body; and an interposer over the conductive ball.

Certain embodiments of the invention have other steps or elements in addition to or in place of those mentioned above. The steps or element will become apparent to those skilled in the art from a reading of the following detailed description when taken with reference to the accompanying drawings.

BRIEF DESCRIPTION OF THE DRAWINGS

FIG. 5 is a cross-sectional view of an integrated circuit package system with interposer support structure mechanism in a fourth embodiment of the present invention.

FIG. 6 is a diagram of example dimensions of the integrated circuit packaging system.

BEST MODE FOR CARRYING OUT THE INVENTION

Figure 1:
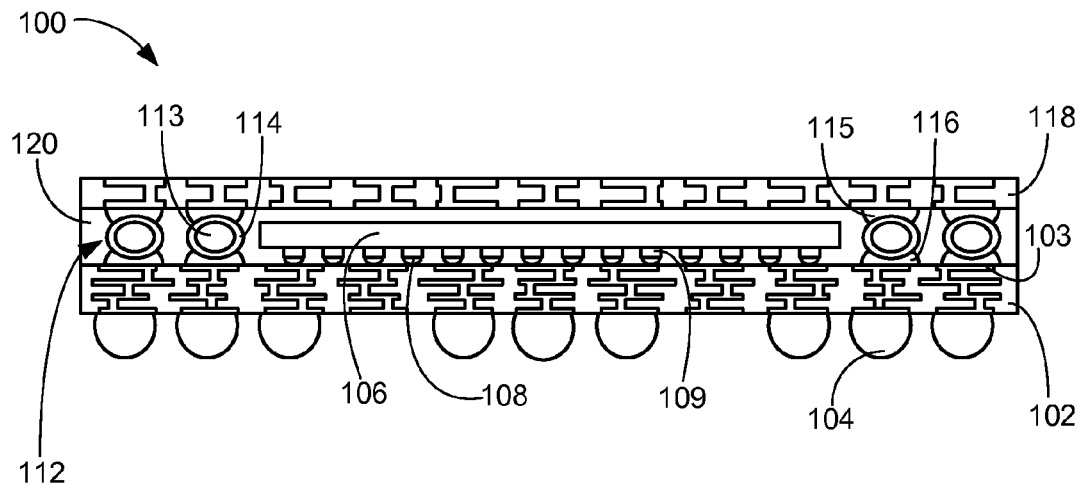
FIG. 1 is a cross-sectional view of a cross-sectional view of an integrated circuit package system with interposer support structure mechanism in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit chip, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means there is direct physical contact between elements. The term "directly on" means there is direct physical contact between elements with no intervening elements. The term "processing" as used herein includes deposition of material, patterning, exposure, development, etching, cleaning, molding, and/or removal of the material or as required in forming a described structure.

Referring now to FIG. 1, therein is shown a cross-sectional view of an integrated circuit packaging system 100 with interposer support structure mechanism in a first embodiment of the present invention. The cross-sectional view can show the package along a line 1-1 of FIG. 2. The integrated circuit packaging system 100 can include a base substrate 102, an integrated circuit device 106, and an interposer 118.

The base substrate 102 can provide support and connectivity for components and devices. For example, the base substrate 102 can include a printed circuit board (PCB), a carrier substrate, a semiconductor substrate with electrical interconnections, a ceramic substrate, or a multi-layer structure (e.g., a laminate with one or more conductive layers separated by an insulator) suitable for electrically interconnecting integrated circuit systems formed on or above the base substrate 102 as examples. For illustrative purposes, the base substrate 102 is shown as a laminated substrate.

The base substrate 102 includes conductive layers and conductive traces embedded therein. The base substrate 102 can include a component side for mounting components, devices, and packages. The base substrate 102 can also include a system side, which is a side opposite to the component side, for connecting to a next system level (not shown).

The base substrate 102 can include a dielectric core, such as dielectric materials, resins, or epoxy as examples. For example, the base substrate 102 can include insulating layers of pre-impregnated (PPG), polymers, reinforcement fibers, glass fabrics, fillers, or other fabrics.

The base substrate 102 can include a base terminal 103. The base terminal 103 is a contact pad formed within the body or within the dielectric core of the base substrate 102. A number of the base terminal 103 can be arranged along the top surface of the base substrate 102 for mounting devices, chips, and interconnects.

The integrated circuit packaging system 100 can include the interposer 118. The interposer 118 can include an identical or similar structure to the base substrate 102, except that the interposer 118 is mounted above the integrated circuit device 106. For example, the interposer 118 can provide support and connectivity for components and devices mounted above the base substrate 102. For illustrative purposes, the interposer 118 is shown as a laminated substrate.

The integrated circuit device 106 is defined as a semiconductor device having one or more integrated transistors for implementing active circuitry. For example, the integrated circuit device 106 can include interconnects, passive devices, or a combination thereof. For example, a flip-chip or a wafer scale chip can be representative of the integrated circuit device 106. The integrated circuit device 106 is preferably shown in a flip-chip configuration. However, it is understood that the integrated circuit device 106 can also be in a wire-bonded configuration.

The integrated circuit device 106 can include an interconnect side for attaching a chip interconnect 108 and a chip pillar 109. The interconnect side of the integrated circuit device 106 can include contacts, fabricated thereon, and be directly attached to the chip interconnect 108. The integrated circuit device 106 can also include a device top side, which is a side opposite the interconnect side.

The chip interconnect 108 and the chip pillar 109 are conductive structures for connecting the integrated circuit device 106 to the base substrate 102. The chip interconnect 108 can include solder balls or solder bumps. The chip pillar 109 can include studs or pillars to facilitate the mounting of the integrated circuit device 106 to the base terminal 103 of the base substrate 102. It has been found that the use of the chip interconnect 108 and the chip pillar 109 provide for smaller pitch between interconnects while the chip pillars prevent solder bridging between one of the chip interconnect 108 and an adjacent interconnect.

The integrated circuit device 106 can be attached or mounted to the component side of the base substrate 102 by the chip interconnect 108 and the chip pillar 109. The chip interconnect 108 can be attached directly to the base terminal 103 of the base substrate 102. System interconnects 104 can be attached to the bottom side of the base substrate 102. The system interconnects 104 can include solder balls or solder bumps as examples.

The integrated circuit packaging system 100 can include conductive joints, which are adhesive metallic structures. For example, a top conductive joint 115 can be attached to the contact pad of the interposer 118 and a bottom conductive joint 116 can be attached to the base terminal 103 of the base substrate 102. The top conductive joint 115 and the bottom conductive joint 116 can include solder paste printing, micro-ball drop, or pre-mounted solder with fluxing.

For example, the conductive joints can include solder paste for attaching the interposer 118, interconnects, and the base substrate 102. The conductive joints can be optional based on the specification of the package such as the clearance height for the integrated circuit device. It has been found that the conductive joints can be used to adjust the height of the package for chip clearance.

The integrated circuit packaging system 100 can include a conductive ball 112. The conductive ball 112 can provide structural support for the interposer, can provide adhesion between the interposer and the base substrate, and can provide electrical connectivity. The conductive ball 112 can surround the integrated circuit device 106 on the periphery of the base substrate 102.

The conductive ball 112 can include a core body 113 and an anti-oxide metallic layer 114, which surrounds the core body 113. The core body 113 of the conductive ball 112 can include a metallic material, which can support the weight of interposers, components, devices, and packages mounted above the integrated circuit device. The core body 113 can preferably be made of a homogenous metallic material with a tensile strength and a compression strength greater than solder. It has been discovered that the strength of the core body 113 allows the use of smaller dimension than solder ball interconnects for supporting the interposer 118. For example, the conductive ball 112 can be twenty percent smaller in diameter than a solder ball, but provide better structural support and crush protection than a solder ball.

For example, the core body 113 can include a body of copper or a copper alloy. The core body 113 is designed to retain its shape and not deform, which has been found to increase reliability and electrical connection strength when used to support mounting structures. It has been found that the core body 113, such as a copper ball can efficiently support the interposer 118 because of the high modulus of copper.

The core body 113 can be sized to provide clearance for the interposer 118 over the integrated circuit device 106 and be sized to provide adequate mass to support the interposer 118 for preventing crush damage to the integrated circuit device 106. For example, the core body 113 can include a diameter of 150 μm to 200 μm for interposer support.

The core body 113 can be coated or surrounded by the anti-oxide metallic layer 114. The structural support provided by the conductive ball 112 provides for packages with a smaller pitch between sets of the conductive balls. For example, the conductive balls can include a top ball pitch of 0.30 μm and under.

The anti-oxide metallic layer 114 is a layer for preventing oxidation of the core body 113 and for facilitating adhesion of the package. The anti-oxide metallic layer 114 can include a non-solder finish, for reducing the diameter size of the ball compared to solder balls and copper core solder balls. For example, the anti-oxide metallic layer 114 can include nickel (Ni), gold (au), palladium (Pd), or a combination thereof such as NiAu, NiPd, and NiPdAu compounds. The anti-oxide metallic layer 114 can include a thin width of 0.01 μm to 4 μm.

The anti-oxide metallic layer 114 also can provide oxidation protection to the core body 113 and facilitates the adhesive of the conductive ball 112 to the base substrate or the top and bottom conductive joints. It has been found that the anti-oxide metallic layer 114 completely surrounds the core body 113 and is formulated to completely surround the core body 113 even after reflow. Further, it has been found that the composition of the anti-oxide metallic layer 114 can ensure that the core body 113 does not deform, which preserves the structural shape and strength of the core body 113.

The integrated circuit packaging system 100 can include an encapsulation 120 between the interposer 118 and the base substrate 102. The encapsulation 120 can be a molding compound that covers the integrated circuit device 106, the conductive ball 112, and the conductive joints. The encapsulation 120 can provide mechanical protection, environmental protection, and a hermetic seal for the integrated circuit packaging system 100. The encapsulation 120 can be made from an epoxy molding compound (EMC), film assisted molding, polymide compound, or a wire-in-film (WIF), as examples.

The structural support provided by the conductive ball 112 protects the integrated circuit device 106 on the base substrate 102 from crush damage from the interposer 118. As such, it has been discovered that extremely thin dies of 100 μm and below can be mounted and protected without the need for an additional package encapsulation, molds, and epoxies. The integrated circuit packaging system can even support dies with a thickness of 70 μm and below.

It has been found that the conductive joints and the conductive ball 112 can be used to adjust the clearance height for the integrated circuit device 106 mounted above the base substrate 102 and beneath the interposer 118. It has also been found that the package configuration provides for extremely fine top ball pitch of 0.3 mm and below. For example, the conductive ball 112 can include a diameter of below 200 μm and still provide enough structural support to elevate the interposer 118 above the integrated circuit device 106.

It has been found that conductive ball 112, having a diameter of about 200 μm to 150 μm, decreases top ball pitch because bond pads can be sized for the metallic cores instead of being sized larger for solder ball connections. The metallic cores provide a stronger structural and electrical connection to the pads while the smaller size of the metallic cores lower the package profile. For example, copper core solder balls (CCSP) include a ball size of over 220 μm, whereas the conductive ball 112 can provide stronger structure support for the interposer 118 and include a smaller ball size of under 190 μm.

Further, the solid copper bodies of the conductive ball 112 prevents solder bridging and shorting between balls over solder balls and CCSPs. Solder bridging with balls of close pitch are eliminated with the solder copper material of the conductive ball 112.

It has been discovered that the conductive ball 112 and extremely thin die can combine to provide a very low package profile with a thickness of 200 μm and below between the interposer 118 and the base substrate 102.

It has also been discovered that the anti-oxide metallic layer 114, the top conductive joint 115, the bottom conductive joint 116, or a combination thereof prevents the core body 113 from deforming. The shape of the conductive ball 112 is preserved which ensures that the die is protected from crush damage and ensures a reliable electrical connection. It has been found that the metallic material in the core, the anti-oxide metallic layer 114, and the conductive joints prevent the core body 113 from deforming and losing shape for ensuring a reliable electrical connection. For example, the core body 113 includes the advantages and structural support of a copper material, while also including anti-oxide benefits from the surrounding layer.

Figure 2:
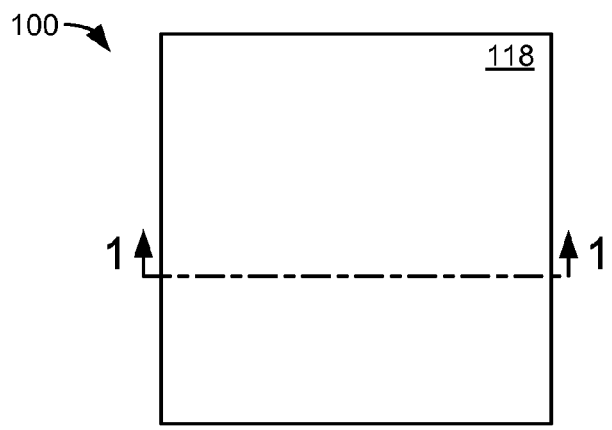
FIG. 2 is a top view of the integrated circuit packaging system of FIG. 1.

Referring now to FIG. 2, therein is shown a top view of the integrated circuit packaging system 100 of FIG. 1. The top side of the interposer 118 is shown.

Figure 3:
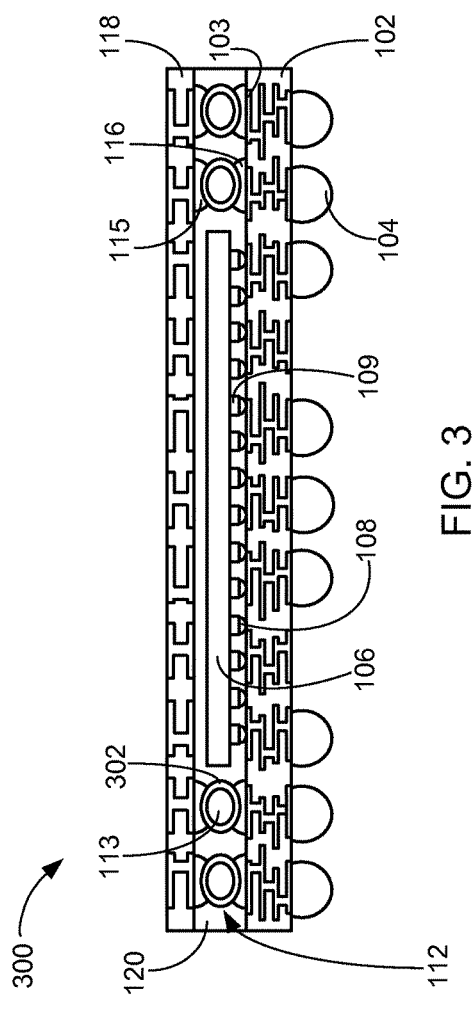
FIG. 3 is a cross-sectional view of an integrated circuit package system with interposer support structure mechanism in a second embodiment of the present invention.

Referring now to FIG. 3, therein is shown a cross-sectional view of an integrated circuit packaging system 300 with interposer support structure mechanism in a second embodiment of the present invention. The integrated circuit packaging system 300 is identical to the integrated circuit packaging system 100, except the integrated circuit packaging system 300 includes a preservative coating 302, instead of the anti-oxide metallic layer 114 of FIG. 1.

The integrated circuit packaging system 300 can include the base substrate 102, the base terminal 103, the system interconnects 104, the integrated circuit device 106, the chip interconnects, the top and bottom conductive joints, the conductive ball 112, the interposer 118, and the encapsulation 120.

The conductive ball 112 includes the preservative coating 302 instead of the anti-oxide metallic layer 114 shown in FIG. 1. The preservative coating 302 can be an organic solderability preservative (OSP). The preservative coating 302 can be optional for cost savings and to decrease manufacturing steps. The thickness of the preservative coating 302 can be within a range of 0.01 μm to 11.0 μm to further reduce pitch and overall package size.

The integrated circuit packaging system 300 and integrated circuit packaging system 100 can include multiple mounting options. For example, the conductive balls can be mounted without conductive joints. It has been found that the conductive ball 112 can include just enough solder finish for adhesion for an additional reduction of package height.

Further for example, the integrated circuit packaging system 300 can include an option to have either a top or bottom conductive joint. Another option for the integrated circuit packaging system 300 can include both a top and bottom conductive joints for bonding with the conductive ball 112. The integrated circuit packaging system 300 can include all of the inventive advantages and benefits as described in the integrated circuit packaging system 100 of FIG. 1.

Figure 4:
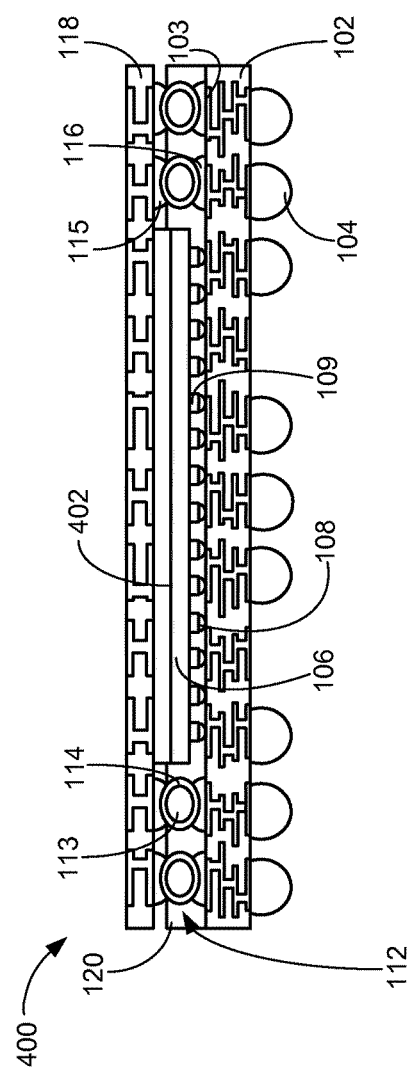
FIG. 4 is a cross-sectional view an integrated circuit package system with interposer support structure mechanism in a third embodiment of the present invention.

Referring now to FIG. 4, therein is shown a cross-sectional view of an integrated circuit packaging system 400 with interposer support structure mechanism in a third embodiment of the present invention. The integrated circuit packaging system 400 can be similar to the integrated circuit packaging system 100 and can share some of the same elements. However, the integrated circuit packaging system 400 includes an interposer adhesive 402 and conductive balls exposed from the encapsulation 120.

The integrated circuit packaging system 400 can include the base substrate 102, the base terminal 103, the system interconnects 104, the integrated circuit device 106, the chip interconnects 108, the top and bottom conductive joints, the conductive ball 112, the anti-oxide metallic layer 114, the interposer 118, and the encapsulation 120.

The integrated circuit packaging system 400 can have the conductive ball 112 exposed from the encapsulation 120 with an interposer clearance height between the interposer 118 and the top surface of the encapsulation 120. The top conductive joint 115 and the exposed portion of the conductive ball 112 can bridge the gap provided by the interposer clearance height.

The interposer adhesive 402 can be formed between the top side of the integrated circuit device 106 and the bottom side of the interposer 118. The interposer adhesive 402 can includes a thermal paste, an epoxy, a silica filler, or a combination thereof. It has been found that the interposer adhesive 402 can function as a heat sink for dissipation of heat away from the integrated circuit device 106. Further, it has been found that airflow and heat dissipation can occur from the air gap or interposer clearance height between the interposer 118 and the top surface of the encapsulation 120.

The integrated circuit packaging system 400 can include multiple mounting options. For example, the conductive balls can be mounted without conductive joints. It has been found that the conductive ball 112 can include just enough solder finish for adhesion for an additional reduction of package height.

The integrated circuit packaging system 400 can include multiple mounting options. For example, the conductive balls can be mounted without conductive joints. It has been found that the conductive ball 112 can include just enough solder finish for adhesion for an additional reduction of package height.

Further for example, the integrated circuit packaging system 400 can include an option to have either a top or bottom conductive joint. Another option for the integrated circuit packaging system 400 can include both a top and bottom conductive joints for bonding with the conductive ball 112. The integrated circuit packaging system 400 can also include an optional underfill (not shown) for providing structure support for extremely thin dies of a thickness of 70 μm and below.

The interposer adhesive 402 and the underfill can prevent warpage and cracking of the integrated circuit device 106 and provide structural support for the surrounding sections of the interposer 118 and the base substrate 102. The integrated circuit packaging system 400 can also include all of the inventive advantages and benefits as described in the integrated circuit packaging system 100 of FIG. 1.

Referring now to FIG. 5, therein is shown a cross-sectional view of an integrated circuit packaging system 500 with interposer support structure mechanism in a fourth embodiment of the present invention. The integrated circuit packaging system 500 is identical to the integrated circuit packaging system 300, except the integrated circuit packaging system 500 includes package modification as shown in FIG. 4.

The integrated circuit packaging system 500 can include the base substrate 102, the base terminal 103, the system interconnects 104, the integrated circuit device 106, the chip interconnects 108, the top and bottom conductive joints, the conductive ball 112, the anti-oxide metallic layer 114, the interposer 118, and the encapsulation 120.

The integrated circuit packaging system 500 can have the conductive ball 112 exposed from the encapsulation 120 with a clearance height between the interposer 118 and the top surface of the encapsulation 120. The top conductive joint 115 and the exposed portion of the conductive ball 112 can bridge the gap provided by the interposer clearance height.

The interposer adhesive 402 can be formed between the top side of the integrated circuit device 106 and the bottom side of the interposer 118. The integrated circuit packaging system 500 can include multiple mounting options. For example, the conductive balls can be mounted without conductive joints. It has been found that the conductive ball 112 can include just enough solder finish for adhesion for an additional reduction of package height.

Further for example, the integrated circuit packaging system 500 can include an option to have either a top or bottom conductive joint. Another option for the integrated circuit packaging system 500 can include both a top and bottom conductive joints for bonding with the conductive ball 112. The integrated circuit packaging system 500 can also include all of the inventive advantages and benefits as described in the integrated circuit packaging system 300 of FIG. 3 and the integrated circuit packaging system 400 of FIG. 4.

The integrated circuit packaging system 500 and the integrated circuit packaging system 400 can use a film-assisted molding process to form the exposed upper tips or protruding portion of the conductive balls above the encapsulation 120.

One example method includes the steps of (a) of providing the base substrate 102 followed by step (b) of forming the conductive ball 112 on the base substrate 102. Next, step (c) includes providing a film, where the film can be substantially planar followed by step (d) of coupling the film to the conductive ball 112.

Step (e) includes depositing the encapsulation 120 over the base substrate 102 and around the conductive balls, where step (e) can be carried out in conjunction or concomitant to step (d). During the encapsulation or molding process of step (e), the encapsulation 120 or the substantially planar film or both are operable to altering the conductive balls from the initial position to an elevated position to achieve the exposed portion of the ball protruding from the encapsulation 120.

During the encapsulation or molding process as the substantially planar film comes into physical contact with the conductive balls and the encapsulation is deposited, the combination of the film and the encapsulation 120, along with the film-assisted molding process conditions (e.g., pressure, temperature), are able to achieve a protrusion of the conductive balls above the top surface of the encapsulation 120. The height of the protrusion can be within a range of 50 µm to 30 µm, which provides enough surface space to mount the conductive ball to a top component, such as the interposer 118.

Referring now to FIG. 6, therein is shown a diagram of example dimensions of the integrated circuit packaging system 400. The integrated circuit packaging system 400 can include the base substrate 102, the base terminal 103, the system interconnects 104, the integrated circuit device 106, the chip interconnects 108, the bottom conductive joint 116, the conductive ball 112, the anti-oxide metallic layer 114, top and bottom solder resist layers, the interposer 118, and the encapsulation 120.

The diagram can show example dimensions that are made possible with top ball pitches (the pitch between conductive balls) from a range of 0.30 mm and below (For illustrative purposes these sizes can include a range between 0.30 mm to 0.20 mm). The diagram can include dimensions for the diameter of the conductive ball 112 (a), the ball to ball space (b), and the height between the bottom solder resist and the interposer 118 (c).

The diagram can also include example dimensions for the die thickness of the integrated circuit device 106 (d), the height from the bottom solder resist to the top surface of the encapsulation 120 (e), and the top ball pitch, between a point on the conductive ball 112 and an identical point on an adjacent ball (f). The diagram can also include a gap or clearance space between the top surface of the integrated circuit device 106 and the bottom surface of the interposer 118 (g).

For packages with a top ball pitch between 0.30 mm to 0.23 mm, the diameter of the core body 113 or copper ball can remain equal. For example, diameter (a) can be 180 µm and below. In packages with a top ball pitch equal to or less than 0.20 mm, the diameter (a) can be reduced by seventeen percent. It has been found that the structure strength of the conductive ball 112 provides the ability to use a ball with a diameter of 180 µm and below in supporting a top interposer. The decreased diameter (a) allows for the reduction of top ball pitch to be 0.30 mm and below.

The conductive ball 112 can provide for the ball to ball spaces (b) between conductive balls to be 120 µm and below. For example, the ball to ball space (b) can be reduced by sixty percent when forming packages with decreased top ball pitch (f).

Die thickness (d) of the integrated circuit device 106 can include a height of 100 µm and below. Further, it has been found that the conductive ball 112 can support can support a thirty percent reduction in die thickness, when reducing the overall package size.

The die height between the interposer 118 and the bottom solder resist layer (e) can be adjusted based on the method of attachment. For example, the height can be below 170 µm if using mass reflow (MR) or below 135 µm if using thermal compression bonding (TCB). It has been found that thermal compression can be used to attach the interposer 118 to the conductive balls to further reduce package height.

The integrated circuit packaging system 400 can include a ball pitch 602, which is shown by the top ball pitch (f). The ball pitch 602 can be between a range of 0.30 µm to 0.20 mm because of the structure support provided by the small sized conductive balls. It has been found that the ball pitch 602 can be reduced in size compared to solder balls because the conductive balls provided more structure support than solder balls of identical dimensions. It has also been found that the solid copper ball construction of the conductive ball 112 prevents solder bridging and shorting over solder balls within a small pitch to each other.

The integrated circuit packaging system 400 can also include an interposer clearance height 604, which is shown by (g), from the top surface of the encapsulation 120 to the bottom surface of the interposer 118. The conductive ball 112 can be exposed from the encapsulation 120 with a height that equals the interposer clearance height 604. This allows the bottom portions of the package to be manufactured before the insertion of the interposer 118 over the conductive ball 112.

The gap between the top interposer and the top of the die can be 50 µm to 30 µm, when using a mass reflow technique. For TCB methods, the range can be from 70 µm to 50 µm. This range can represent the height or thickness of the optional interposer adhesive (not shown in FIG. 6) between the top of the integrated circuit device 106 and the bottom of the interposer 118.

An underfill 606 can be between the integrated circuit device 106 and the base substrate 102. The underfill 606 can be a molding material for protecting the chip pillar 109 and the chip interconnect 108.

The diagram can also include detailed view of the conductive ball 112. The conductive ball 112 can include a layer thickness 608 for the coating surrounding the core body 113. The coating can include the anti-oxide metallic layer 114 of FIG. 1 or the preservative coating 302 of FIG. 3. The coating is a thin layer of between 0.01 μm and 0.4 μm for protecting the surface of the core body 113.

It has been discovered that the conductive ball 112 provides small dimensions between components in the package compared with more complex or solder-ball dependent package designs. The conductive ball 112 can provide for small bond pads and pitches and still provide crush and environmental protection for the integrated circuit device 106.

It has been found that the reduced pitch provided by the conductive ball 112 allows for finer top ball pitch, which reduces the signal and power travel path of the package. Package profile is also reduced because of the strong structural support provided by the conductive ball 112 of 180 μm and under against crush damage to the integrated circuit device. It has been discovered that the core body 113, such as a copper core, provides a strong and non-brittle connection between the interposer and the base substrate.

Figure 7:
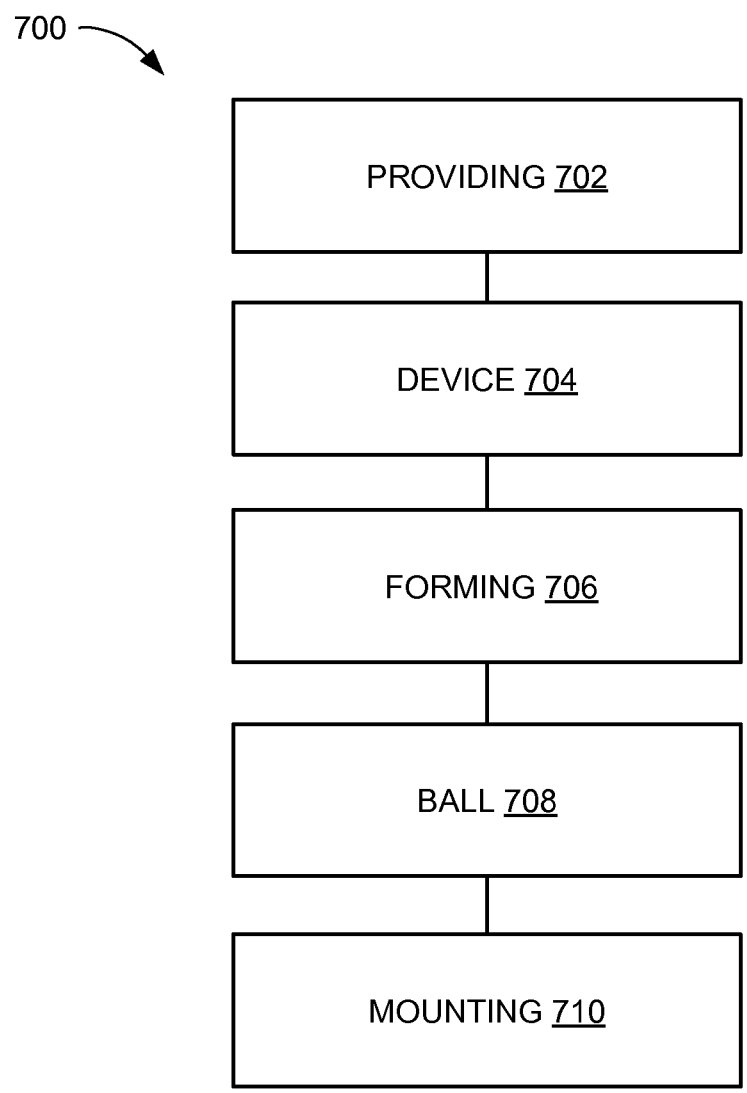
FIG. 7 is a flow chart of a method of manufacture of an integrated circuit packaging system in a further embodiment of the present invention.

Referring now to FIG. 7, therein is shown a flow chart of a method 700 of manufacture of an integrated circuit packaging system in a further embodiment of the present invention. The method 700 includes: providing a base substrate, the base substrate includes a base terminal in a block 702; mounting an integrated circuit device on the base substrate in a block 704; forming a bottom conductive joint on the base terminal in a block 706; mounting a conductive ball on the bottom conductive joint, the conductive ball includes a core body in a block 708; and mounting an interposer over the conductive ball in a block 710.

Optionally, the example flow can include a pre-solder process. After mounting the integrated circuit device, conductive joint material, such as solder, can be attached to the base substrate, interposer, or combination thereof.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   mounting an integrated circuit device over a base substrate;
   forming a bottom conductive joint over a base terminal of the base substrate the bottom conductive joint having pre-mounted solder with fluxing in direct contact with the base terminal;
   mounting a conductive ball over the bottom conductive joint that has been pre-mounted over the base terminal, the conductive ball having a core body and a coating on the core body, the coating having a thickness of less than approximately 4 micrometers (μm), the conductive ball having a pitch in an approximate range of 0.2 millimeters (mm) to 0.3 mm, and the core body having a diameter in an approximate range of 150 μm to 200 μm;
   forming an interposer with a top conductive joint; and
   mounting the interposer with the top conductive joint over the conductive ball;
   and
   wherein the top conductive joint, the bottom conductive joint, and the coating are distinct from each other, the top conductive joint is in direct contact with the conductive ball, and the conductive ball is in direct contact with the bottom conductive joint.

2. The method as claimed in claim 1, further comprising forming an encapsulation between the interposer and the base substrate.

3. The method as claimed in claim 1, further comprising applying an interposer adhesive between the integrated circuit device and the interposer.

4. The method as claimed in claim 1, wherein the coating is an anti-oxide metallic layer surrounding the core body, the anti-oxide metallic layer including Ni, Au, NiPd, NiAu, NiPdAu, or a combination thereof.

5. The method as claimed in claim 1, wherein the coating is a preservative coating surrounding the core body, the preservative coating including an organic solderability preservative.

6. A method of manufacture of an integrated circuit packaging system comprising:
   mounting an integrated circuit device over a base substrate;
   forming a bottom conductive joint over a base terminal of the base substrate, the bottom conductive joint having pre-mounted solder with fluxing in direct contact with the base terminal;
   mounting a conductive ball over the bottom conductive joint that has been pre-mounted over the base terminal, the conductive ball having a core body and a coating on the core body, the coating having a thickness of less than approximately 4 micrometers (μm), the conductive ball having a pitch of less than or equal to approximately 0.3 millimeters;
   forming an interposer with a top conductive joint; and
   mounting the interposer with the top conductive joint over the conductive ball;
   and
   wherein the top conductive joint, the bottom conductive joint, and the coating are distinct from each other, and the conductive ball is directly in between the entirety of the top conductive joint and the entirety of the bottom conductive joint.

7. The method as claimed in claim 6, wherein mounting the conductive ball includes mounting a copper ball.

8. The method as claimed in claim 6, further comprising applying an underfill between the integrated circuit device and the base substrate.

9. The method as claimed in claim 6, wherein mounting the conductive ball includes mounting the conductive ball having the coating around the core body, the coating having a layer thickness of an approximate range of 0.01 μm to 4 μm.

10. The method as claimed in claim 6, wherein the top conductive joint includes pre-mounted solder with fluxing.

\* \* \* \* \*